(12) United States Patent
Kim et al.

(10) Patent No.: US 10,012,900 B2
(45) Date of Patent: Jul. 3, 2018

(54) METHOD OF CORRECTING MASK PATTERN AND METHOD OF MANUFACTURING RETICLE

(71) Applicant: SAMSUNG ELECTRONICS CO., LTD., Suwon-si, Gyeonggi-do (KR)

(72) Inventors: Jong-su Kim, Hwaseong-si (KR); Shuichi Tamamushi, Hwaseong-si (KR); In-kyun Shin, Yongin-si (KR); Sung-il Lee, Anyang-si (KR); Jin Choi, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/218,284

(22) Filed: Jul. 25, 2016

(65) Prior Publication Data

US 2017/0082921 A1 Mar. 23, 2017

(30) Foreign Application Priority Data

Sep. 22, 2015 (KR) .......................... 10-2015-0134009

(51) Int. Cl.
*G03B 27/32* (2006.01)
*G03B 27/52* (2006.01)
(Continued)

(52) U.S. Cl.
CPC .................. *G03F 1/70* (2013.01); *G03F 1/78* (2013.01); *G03F 7/2059* (2013.01); *G03F 7/70616* (2013.01); *G03F 7/70875* (2013.01)

(58) Field of Classification Search
CPC ..... G03F 1/36; G03F 1/70; G03F 1/76; G03F 1/78; G03F 7/2059; G03F 7/2061;
(Continued)

(56) References Cited

U.S. PATENT DOCUMENTS 5,847,959 A 12/1998 Veneklasen et al.
6,424,879 B1 * 7/2002 Chilese .................. B82Y 10/00
250/491.1
(Continued)

FOREIGN PATENT DOCUMENTS

JP 2012-501474 A 1/2012
JP 2014-112087 A 6/2014
(Continued)

OTHER PUBLICATIONS

Kamikubo, et al. "Study of Heating Effect on CAR in Electron Beam Mask Writing" Proc. of SPIE vol. 6607, 660723 (2007) pp. 1-9.
(Continued)

*Primary Examiner* — Colin Kreutzer
(74) *Attorney, Agent, or Firm* — Lee & Morse, P.C.

(57) ABSTRACT

A method of manufacturing a reticle, the method including preparing a substrate, determining position data of a pattern to be formed on the substrate, and setting a primary exposure condition to form the pattern; performing a primary exposure simulation regarding the substrate based on the position data of the pattern and the primary exposure condition; calculating a primary deformation rate of the substrate, which is generated in the primary exposure simulation; correcting the position data of the pattern based on the primary deformation rate of the substrate to provide a corrected position data of the pattern; and exposing the substrate under the primary exposure condition based on the corrected position data of the pattern.

15 Claims, 13 Drawing Sheets

(51) Int. Cl.
*G06F 17/50* (2006.01)
*G21K 5/00* (2006.01)
*G03F 1/70* (2012.01)
*G03F 7/20* (2006.01)
*G03F 1/78* (2012.01)

(58) Field of Classification Search
CPC ............. G03F 7/70383; G03F 7/70616; G03F 7/70875; G06F 17/5081
USPC ..... 250/492.2–492.3; 355/30, 53, 77; 430/5, 430/30; 716/54
See application file for complete search history.

(56) References Cited

U.S. PATENT DOCUMENTS

| | | | |
|---|---|---|---|
| 6,720,565 | B2 | 4/2004 | Innes et al. |
| 6,738,128 | B2 | 5/2004 | Shima et al. |
| 7,483,196 | B2 | 1/2009 | Allen et al. |
| 7,492,443 | B2 | 2/2009 | Van Der Werf et al. |
| 7,554,107 | B2 | 6/2009 | Yoshitake et al. |
| 7,799,489 | B2 | 9/2010 | Fujimura et al. |
| 7,824,828 | B2 | 11/2010 | Fujimura et al. |
| 8,129,698 | B2 | 3/2012 | Nakayamada et al. |
| 8,563,953 | B2 | 10/2013 | Nakayamada et al. |
| 8,916,482 | B2 | 12/2014 | Lee et al. |
| 2005/0136346 | A1 | 6/2005 | Ottens et al. |
| 2014/0359542 | A1 | 12/2014 | Fujimura et al. |
| 2015/0024306 | A1 | 1/2015 | Tu et al. |
| 2015/0227038 | A1* | 8/2015 | Tu .............................. G03F 1/22 355/53 |
| 2017/0124247 | A1* | 5/2017 | Fujimura ............ G06F 17/5081 |

FOREIGN PATENT DOCUMENTS

| | | |
|---|---|---|
| KR | 10-2004-0062435 A | 7/2004 |
| KR | 10-2011-0063806 A | 6/2011 |
| KR | 10-1106829 B1 | 1/2012 |

OTHER PUBLICATIONS

Kim, et al. "Impact of Mask Line Edge Roughness and Statistical Noise on Next Generation Mask Making" Proc. of SPIE vol. 8441, 84410Y (2012) pp. 1-7.

Lee, et al. "Challenges and Technical Requirements for Multi-Beam Mask Writer Development" Proc. of SPIE vol. 9256, 925606 (2014) pp. 1-8.

* cited by examiner

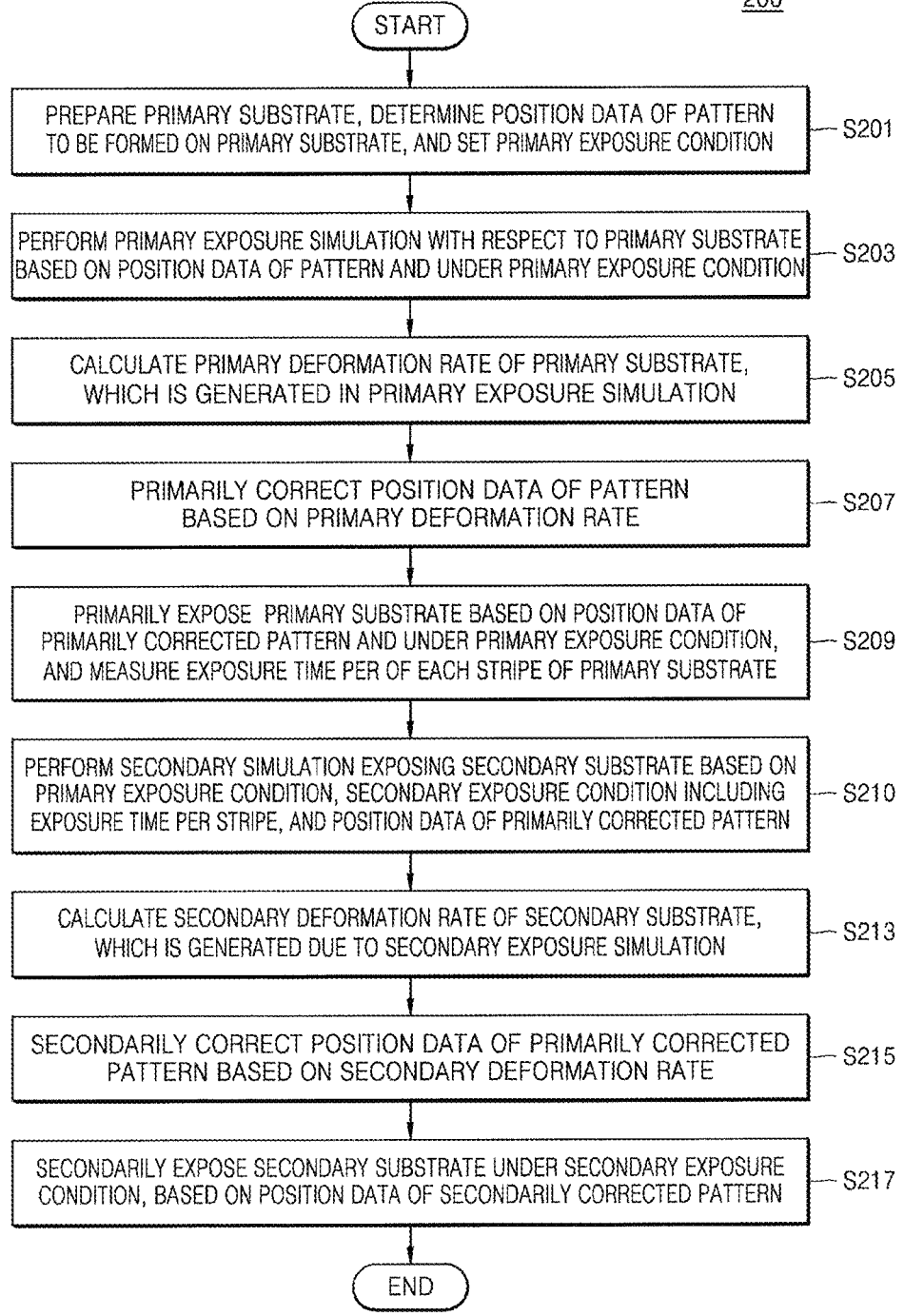

METHOD OF CORRECTING MASK PATTERN AND METHOD OF MANUFACTURING RETICLE

CROSS-REFERENCE TO RELATED APPLICATION

Korean Patent Application No. 10-2015-0134009, filed on Sep. 22, 2015, in the Korean Intellectual Property Office, and entitled: "Method of Correcting Mask Pattern and Method of Manufacturing Reticle," is incorporated by reference herein in its entirety.

BACKGROUND

1. Field

Embodiments relate to methods of correcting a mask pattern and methods of manufacturing a reticle using the mask pattern.

2. Description of the Related Art

A reticle is a mask for transferring a designed circuit to a wafer. The reticle may include a light shielding film formed on a blank mask and a photoresist layer and may be manufactured through processes of exposure and developing to form a circuit pattern. A reticle having a circuit pattern may function as a mask selectively blocking light on a wafer. A photoresist layer on the wafer may form a mask pattern according to exposure via the reticle, and the wafer may be etched along the mask pattern, and a circuit pattern may be formed.

SUMMARY

Embodiments may be realized by providing a method of manufacturing a reticle, the method including preparing a substrate, determining position data of a pattern to be formed on the substrate, and setting a primary exposure condition to form the pattern; performing a primary exposure simulation regarding the substrate based on the position data of the pattern and the primary exposure condition; calculating a primary deformation rate of the substrate, which is generated in the primary exposure simulation; correcting the position data of the pattern based on the primary deformation rate of the substrate to provide a corrected position data of the pattern; and exposing the substrate under the primary exposure condition based on the corrected position data of the pattern.

The primary exposure condition may be one or more of a pattern density per unit region, an exposure dose per unit region, total injection energy, a total exposure time, injection energy per stripe, or an exposure time per stripe with regard to the substrate.

Performing the primary simulation may include calculating a temperature profile of the substrate and calculating a deformation rate of the substrate based on the temperature profile.

Performing the primary simulation may include calculating a deformation rate of the substrate in time.

The exposure during the primary simulation may be performed on every stripe forming the substrate, and calculating the primary deformation rate may include calculating a deformation rate of each of stripes forming the substrate.

In calculating the primary deformation rate, the primary deformation rate of each of the stripes may be a deformation rate when each of the stripes is exposed.

In calculating the primary deformation rate, the primary deformation rate of each of the stripes may be a deformation rate when each of the stripes is deformed in maximum.

In calculating the primary deformation rate, the primary deformation rate of each of the stripes may be a deformation rate of each of the stripes at a maximum temperature.

Calculating the primary deformation rate may include calculating a deformed profile of an edge on the substrate.

Calculating the primary deformation rate may include calculating a deformation rate of each of the stripes on the substrate, and correcting the position data of the pattern based on the primary deformation rate of the substrate may include correcting the position data of the pattern so that a pattern located in each of the stripes is a pattern having a deformation rate according to the deformation rate of each of the stripes.

Exposing the substrate under the primary exposure condition based on the corrected position data of the pattern may further include measuring an exposure time with respect to each of the stripes while exposing the stripes forming the substrate, and the method may further include, after exposing the substrate under the primary exposure condition based on the corrected position data of the pattern, under a secondary exposure condition including the primary exposure condition and the exposure time of each of the stripes performing a secondary simulation on a secondary substrate; calculating a secondary deformation rate of the secondary substrate; and correcting the position data of the pattern based on the secondary deformation rate of the secondary substrate to provide a corrected pattern under the secondary exposure condition.

The method may further include exposing the secondary substrate based on the position data of the corrected pattern under the secondary exposure condition.

An exposure device used for performing the primary simulation and the primary exposing may be a multi beam exposure device.

An exposure device used for performing the primary simulation and the primary exposing may be a variable shaped beam exposure device.

Embodiments may be realized by providing a method of correcting a mask pattern, the method including performing an exposure simulation with regard to a substrate including a mask layer based on position data of a desired pattern; calculating a deformation rate of the substrate, which is generated in the exposure simulation; generating a correction map correcting the position data of the desired pattern based on the deformation rate of the substrate; and exposing the mask layer of the substrate based on the position data of a corrected pattern by the correction map and forming a mask pattern.

Embodiments may be realized by providing a method of correcting a mask pattern in real-time, the method including predicting a deformation of a substrate; generating a correction map for correcting pattern data so as to compensate for the deformation of the substrate; and correcting designed pattern data based on the correction map before an exposure process is performed.

The substrate may have a first substrate width; the designed pattern data before correction may include a first pattern width; and predicting the deformation of the substrate may include determining a second substrate width and a second pattern width.

The second pattern width/the first pattern width may be proportional to the second substrate width/the first substrate width.

The method may further include performing the exposure process. The substrate may have the second substrate width after the exposure process is completed.

The method may further include cooling the substrate after the exposure process is completed. A width of the substrate after cooling may be equal to the first substrate width.

BRIEF DESCRIPTION OF THE DRAWINGS

Features will become apparent to those of skill in the art by describing in detail exemplary embodiments with reference to the attached drawings in which:

FIG. 7 illustrates a flowchart of a method of manufacturing a reticle according to embodiments;

DETAILED DESCRIPTION

Figure 1:
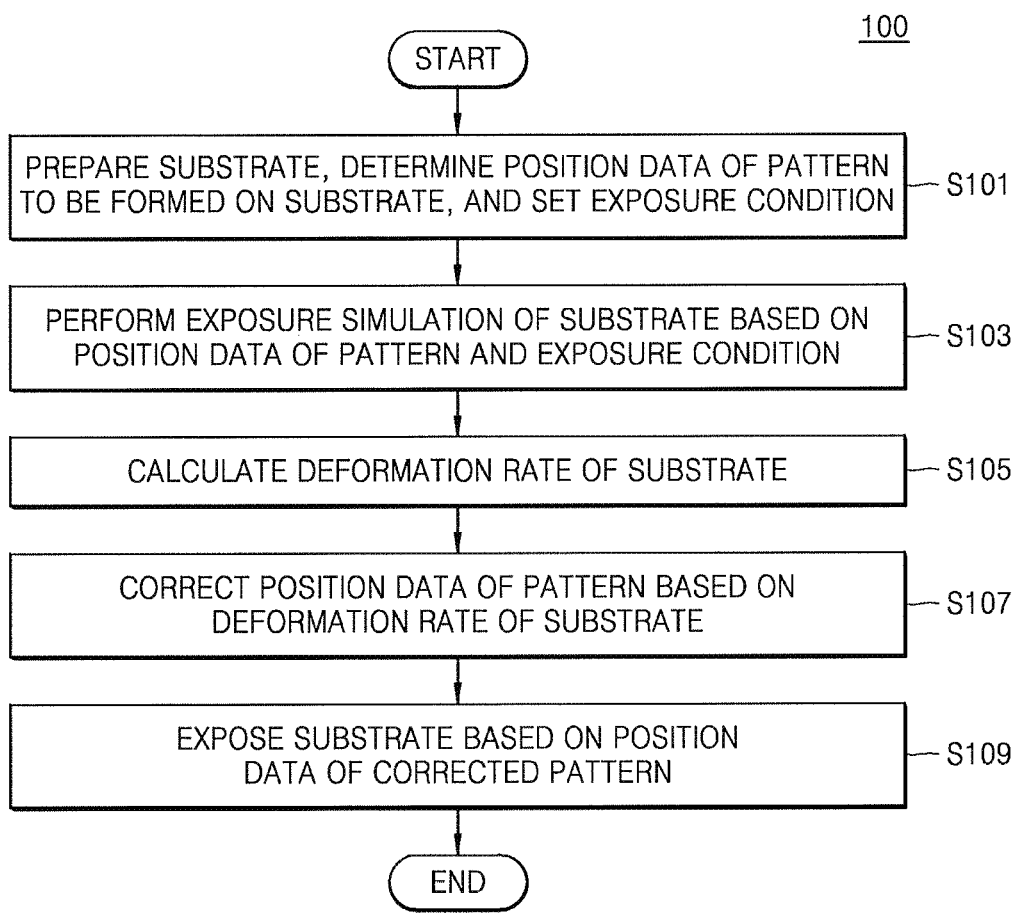
FIG. 1 illustrates a flowchart of a method of manufacturing a reticle according to embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the sizes of layers and regions may be exaggerated for clarity. The same reference numerals are used to denote the same elements, and repeated descriptions thereof will be omitted.

It will be understood that, although the terms "first," "second," etc., may be used herein to describe various elements, components, regions, layers and/or sections, these elements, components, regions, layers and/or sections should not be limited by these terms. Thus, a first element, component, region, layer or section discussed below could be termed a second element, component, region, layer or section.

Unless otherwise defined, all terms (including technical and scientific terms) used herein have the same meaning as commonly understood by one of skill in the art. It will be further understood that terms, such as those defined as commonly used dictionaries, should be interpreted as having a meaning that is consistent with their meaning in the context of the relevant art and this specification and will not be interpreted in an idealized or overly formal sense unless explicitly so defined herein.

When some embodiments may be embodied otherwise, respective process steps described herein may be performed otherwise. For example, two process steps described in a sequential order may be performed substantially the same time or in reverse order.

Variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Expressions such as "at least one of," when preceding a list of elements, modify the entire list of elements and do not modify the individual elements of the list.

FIG. 1 illustrates a flowchart of a method 100 of manufacturing a reticle according to embodiments. Referring to FIG. 1, a substrate 10 to form a reticle may be prepared, position data of a pattern to be formed on the substrate 10 may be determined, and an exposure condition to form the pattern on the substrate 10 may be set (S101). The position data of the pattern and the exposure condition may be used in an exposure simulation operation (S103), an operation of calculating a deformation rate of the substrate 10 (S105), and an operation of correcting the position data of the pattern (S107) prior to performing an actual exposure operation (S109) on the substrate 10.

Figure 10A:
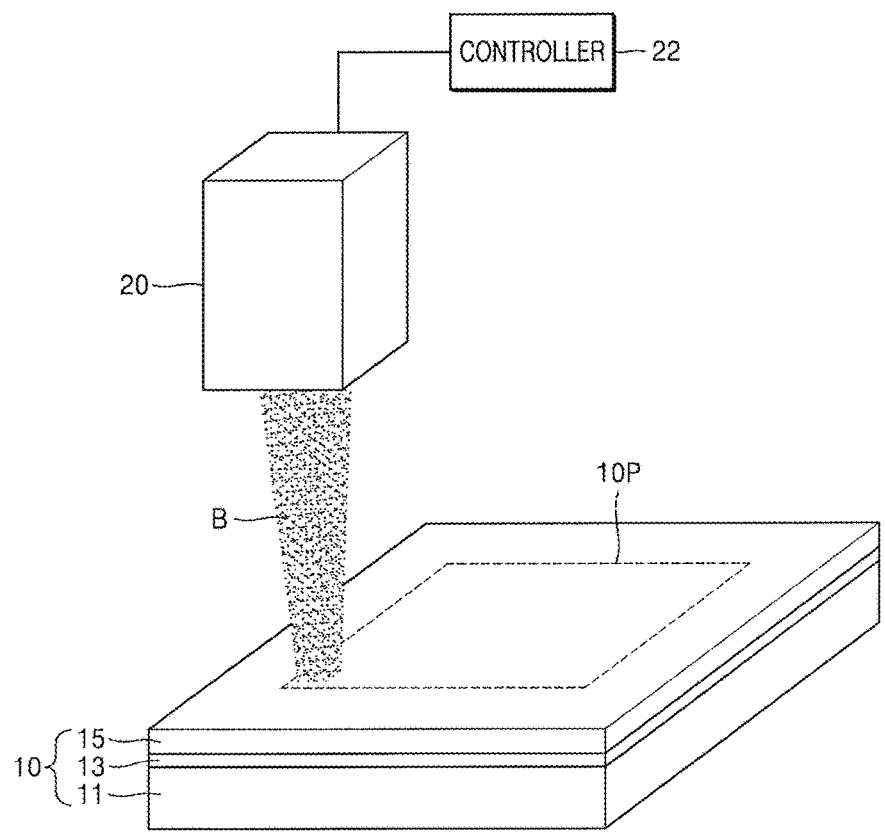
FIGS. 10A and 10B respectively illustrate electron beam exposure devices used in a method of manufacturing a reticle and a method of correcting a mask pattern, according to embodiments.
Figure 10B:
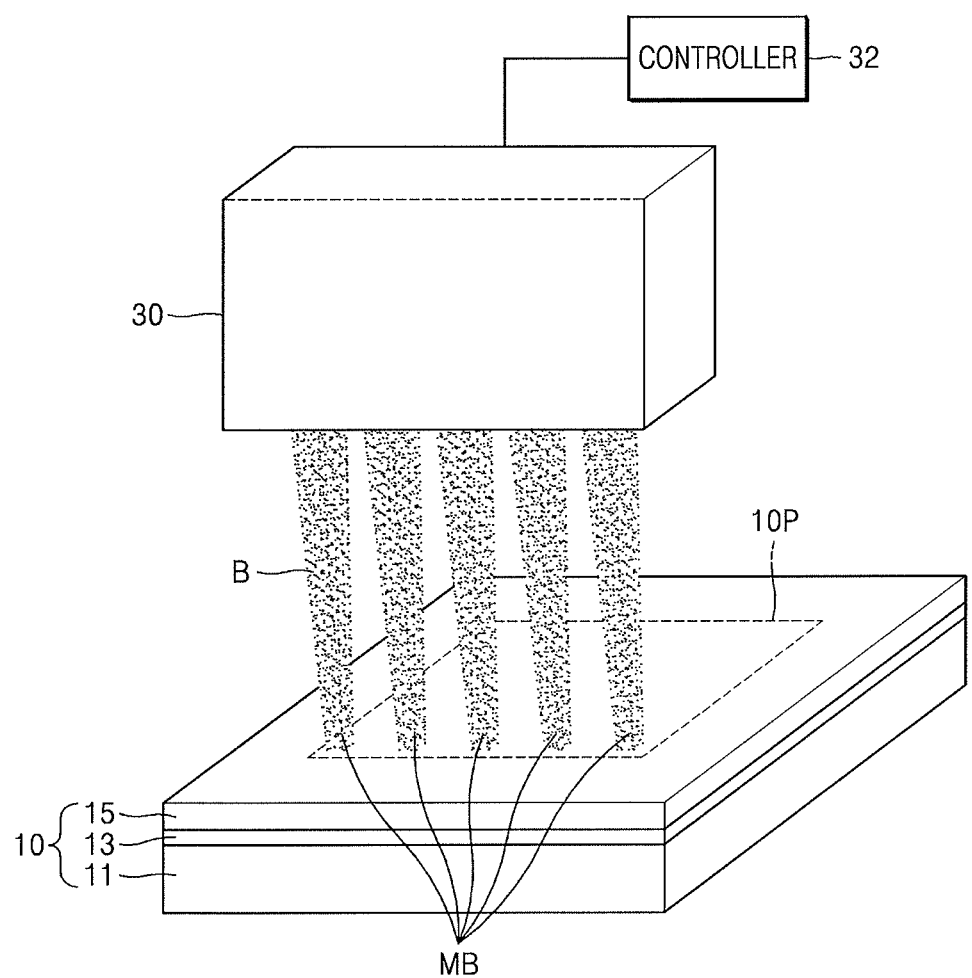

Referring to FIGS. 10A and 10B with FIG. 1, the substrate 10 may include a transparent blank mask 11 including a quartz material, a light shielding film 13 formed on the blank mask 11, and a photoresist layer 15 laminated on the light shielding film 13. The substrate 10 may be a reticle used in a lithography process to manufacture a wafer. A developing degree of the photoresist layer 15 may vary according to an exposure dose of electron beams B and MB. In order to form a suitable photoresist pattern, an exposure dose of each of the electron beams B and MB for scanning a unit region of the photoresist layer 15 may be determined according to a type and thickness of the photoresist layer 15. An exposure device 20 shown in FIG. 10A may output a single electron beam B and may be a variable shaped beam (VSB) exposure device. An exposure device 30 shown in FIG. 10B may be a multi-beam exposure device outputting a plurality of electron beams MB. After the exposure simulation operation (S103), the operation of calculating a deformation rate of the substrate 10 (S105), and the operation of correcting the position data of the pattern (S107) may be performed in order to use the electron beam exposure devices 20 and 30 for an actual exposure of the substrate 10 based on the position data of the corrected pattern. Detailed descriptions are as follows.

When the electron beams B and MB are scanned on the substrate 10, a temperature of the substrate 10 may rise due to, for example, a heating effect caused by, for example, the electron beams B and MB. The electron beams B and MB having a minimum exposure dose required for forming a suitable photoresist pattern may also generate the heating effect on the substrate 10.

When the substrate 10 is heated in the exposure process, the substrate 10 may expand. Before expansion, the substrate 10 may have a pattern formed thereon, which expands during the exposure process along with the substrate 10. When the substrate 10 cools down in time after the exposure process is completed, the substrate 10 may shrink, e.g., contract, to the original size, also shrinking the pattern on the substrate 10 back from the expanded state. Position data of the pattern that has been expanded and contracted may differ from that of the pattern originally formed on the substrate 10, and a registration error may occur. A pattern matching the position data of the original pattern may be formed on the substrate 10 during an initial exposure. However, a registration error may occur over time, e.g., as the substrate is used as a reticle for successive exposures of different wafers. Registration is an arrangement state of patterns with respect to design positions thereof. Expansion and shrinkage of the substrate 10 may simultaneously cause registration errors due to, for example, size deformation and misalignment of the pattern.

The method 100 of manufacturing a reticle according to embodiments may include operation S101 of providing the substrate 10 to be used under an actual exposure condition, determining position data of the pattern to be formed on the substrate 10, and setting an exposure condition, operation S103 of performing an exposure simulation based on operation S101, operation S105 of calculating a deformation rate of the substrate 10 in advance during the exposure simulation, and operation S107 of correcting the position data of the pattern in advance to have the same deformation rate as that of the substrate 10 during the exposure simulation so as to compensate for the deformation rate of the substrate 10. In the method 100, a correction map may be generated by correcting position data of every pattern formed on the substrate 10.

In operation S109, when an actual exposure process is performed on the substrate 10 based on the position data of the corrected pattern and the exposure condition, a registration error may be reduced as a pattern formed on the substrate 10 in an expanded state, although the substrate 10 may contract over time, may match with the position data of the original pattern before the actual exposure process.

The position data of the pattern is position information about the pattern to be formed on the substrate 10, for example. The position data of the pattern may be a pattern layout.

The exposure condition may include all conditions affecting an exposure process for forming the pattern on the substrate 10. For example, the exposure condition may be one or more of a pattern density per zone of the substrate 10, an exposure dose per unit region, total injection energy, a total exposure time, injection energy per stripe, or an exposure time per stripe. The exposure condition may be used to perform an exposure simulation as described below.

The pattern density per zone is defined as a pattern density of respective zones in a pattern region 10P of the substrate 10, wherein the zones are classified according to a similarity of the pattern density. If any of the zones has a relatively high pattern density, a total exposure dose may be increased due to, for example, exposure to form a pattern, and also exposure, which may be inevitably generated, to form adjacent patterns. As the pattern density of the zone may increase, a size expansion may increase due to, for example, a heating effect, and the pattern density per zone may be a parameter reflecting respective size deformation rates of zones in the substrate 10 during the exposure simulation. The pattern density per zone may be obtained by inputting position data of the pattern to the exposure devices 20 and 30. The pattern density per zone will be described in detail with reference to FIGS. 2A and 2B.

The exposure dose per unit region may be determined according to a type and thickness of the photoresist layer 15. The developing degree of the photoresist layer 15 may be determined according to the exposure dose per unit region, and a proper photoresist pattern may be formed, for example, only when the exposure dose per unit region is restricted in a certain range. The exposure dose per unit region may have a uniform exposure condition all over the substrate 10, and the exposure dose per unit region may be a parameter reflecting a total size deformation rate of the substrate 10 during the exposure simulation.

The total injection energy is defined as amount of energy injected to expose the substrate 10 and may be determined based on the applied voltage, current, and an exposure time. The total injection energy, which is a numerical value with respect to the entire region of the substrate 10, may be a parameter reflecting a total size deformation rate of the substrate 10 during the exposure simulation.

The total exposure time is defined as a total time required for forming a pattern on the substrate 10. The total exposure time, which is a numerical value with respect to the entire region of the substrate 10, may be a parameter reflecting a total size deformation rate of the substrate 10 during the exposure simulation. The total exposure time may be obtained through an exposure time prediction program stored in controllers 22 and 32, for example, dowsing DWS. The controllers 22 and 32 are connected to the exposure devices 20 and 30, respectively.

The stripe may be at least one line to be exposed by an electron beam exposure device, and the injection energy per stripe and the exposure time per stripe, which are detailed exposure conditions with regard to the position data of the pattern, may be parameters reflecting respective size deformation rates of stripes on the substrate 10 during the exposure simulation. The exposure simulation based on the injection energy per stripe and the exposure time per stripe may fully match the actual exposure, and it may be possible to accurately predict a deformation rate of the substrate 10 and generate considerably improved correction map of the position data of the pattern.

The exposure conditions such as a pattern density per zone, an exposure dose per unit region, total injection energy, a total exposure time, injection energy per stripe, and an exposure time per stripe with regard to the substrate 10 may be obtained by performing an actual exposure process on a preliminary substrate, for example. According to an embodiment, each of the exposure conditions may be determined via an individual process without performing an actual exposure process.

Figure 2A:
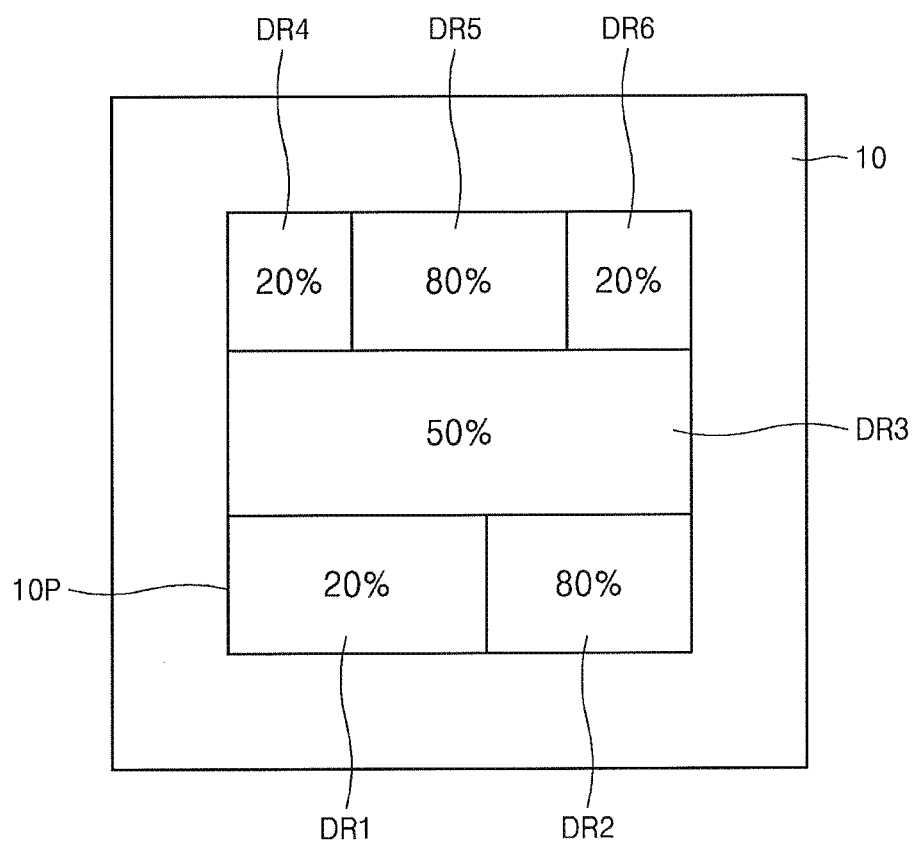
FIGS. 2A and 2B respectively illustrate views of exposure conditions such as a pattern density per zone and an exposure time per stripe, according to embodiments.
Figure 2B:
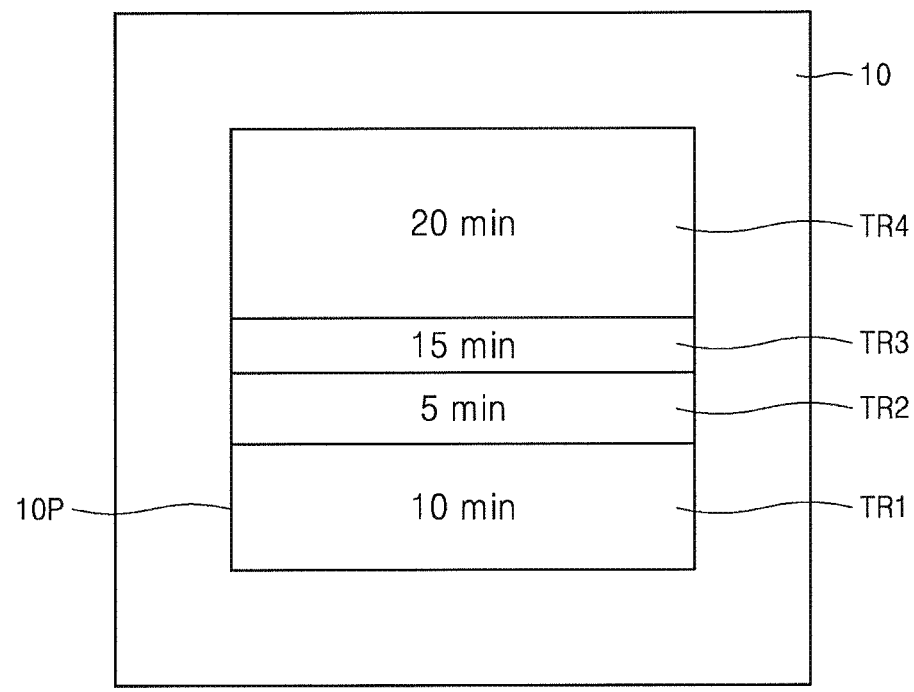

FIGS. 2A and 2B respectively illustrate views of exposure conditions such as a pattern density per zone and an exposure time per stripe, according to embodiments. Referring to FIG. 2A, a pattern region 10P of the substrate 10 may include respective pattern density of six pattern zones DR1 through DR6. The six pattern zones DR1 through DR6 are classified according to similarity of the pattern density. The pattern density of the first pattern zone DR1 may be about 20%, and the pattern density of the second pattern zone DR2 may be about 80%. In an embodiment, the pattern densities may be different from each other even in a same stripe. The pattern density of the third pattern zone DR3 may be about 50%, and the pattern density of the fourth and sixth pattern zones DR4 and DR6 may be about 20%, and the pattern density of the fifth pattern zone DR5 may be about 80%. The pattern density per zone may be obtained by inputting position data of the pattern to the exposure devices 20 and 30.

If any of the pattern zones has a relatively high pattern density, a total exposure dose may be increased due to, for example, exposure to form a pattern, and also exposure, which may be inevitably generated, to form adjacent patterns. As the higher the pattern density of the zone increases, size expansion may also increase due to, for example, a heating effect, and the pattern density per zone may be an important parameter reflecting respective size deformation rates of zones in the substrate 10 during an exposure simulation.

FIG. 2A illustrates an average pattern density of the six pattern zones DR1 through DR6 in the pattern region 10P, for example. More detailed zones or patterns in the pattern region 10P may be selected as an exposure condition according to an embodiment.

Referring to FIG. 2B, a pattern region 10P of the substrate 10 may include respective exposure times of four speed zones TR1 through TR4. The four speed zones TR1 through TR4 are classified according to similarity of the exposure time, for example, exposure speed. The four speed zones TR1 through TR4 may include a plurality of stripes.

The exposure speed of the first speed zone TR1 may be about ten minutes. The exposure speed of the second speed zone TR2 may be about five minutes and that of the third speed zone TR3 may be about fifteen minutes. The exposure speeds of the second and third speed zones TR2 and TR3 may be different from each other as described above in spite of being included in the same third pattern. The exposure speed of the fourth speed zone TR4 may be about twenty minutes.

The higher the exposure speed in the speed zone may be, the smaller the exposure dose may be. The lower the exposure speed in the speed zone may be, the larger the size expansion may be due to, for example, the heating effect, and the exposure time per stripe may be an important parameter reflecting respective size deformation rates of zones in the substrate 10 during the exposure simulation.

The exposure simulation based on a plurality of exposure conditions may fully match the actual exposure, and it may be possible to more accurately predict a deformation rate of the substrate 10 and generate a considerably improved correction map of position data of the pattern.

Figure 3:
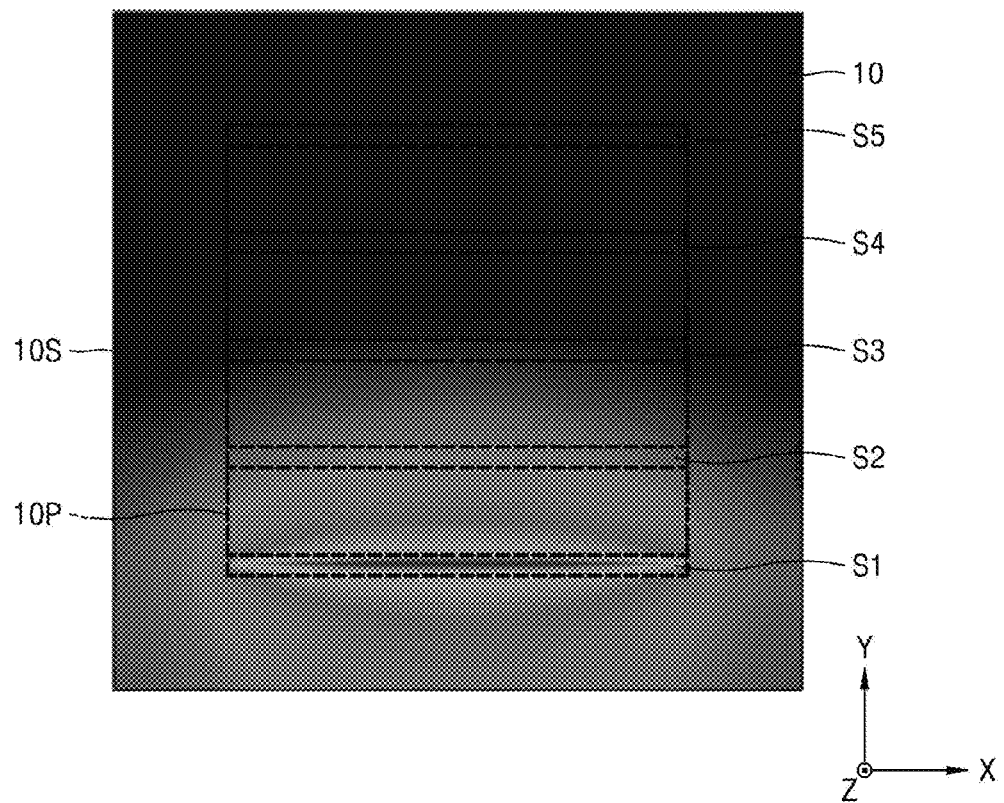
FIG. 3 illustrates a view of a temperature profile of a substrate during an exposure simulation, according to embodiments.

FIG. 3 illustrates a view of a temperature profile of a substrate during an exposure simulation, according to embodiments. Referring to FIGS. 1 and 3, in operation S103, the exposure simulation may be performed based on the substrate 10 to be used for actual exposure, position data of a pattern to be formed on the substrate 10, and an exposure condition.

The exposure simulation may be described via a line-shaped electron beam extending in an X-direction to expose the entire substrate 10 while moving from a lower portion of the substrate 10 in a Y-direction. The exposure simulation operation (S103) may be performed on every stripe forming the substrate 10. FIG. 3 illustrates, for example, first through fifth stripes S1 through S5. In an embodiment, the exposure simulation may include an operation of continuously exposing the substrate 10 from the first stripe S1 to the fifth stripe S5.

FIG. 3 illustrates an operation of exposing the first stripe S1 via a line-shaped electron beam, and a temperature may be radially lowered around the first stripe S1. A temperature may be highest in the first stripe S1 and may decrease in a direction away from the first stripe S1, e.g., the temperature may decrease from a center of the first stripe S1 in both a x- and y-directions, the temperature may decrease less quickly from a center of the first stripe S1 in x-directions than y-directions, and the temperature may decrease less quickly in a direction from the first stripe S1 toward second through fifth stripes S2 through S5 than away from the second through fifth stripes S2 through S5.

FIG. 3 illustrates, for example, the operation of exposing the first stripe S1. In an embodiment, the exposure simulation may include an operation of exposing the substrate 10 while continuously moving the electron beam from the first stripe S1 to the fifth stripe S5 in the Y-direction, and a temperature profile may be formed, in which a temperature may be radially lowered around each of the second through fifth stripes S2 through S5.

The line-shaped electron beam may move sequentially on the first through fifth stripes S1 through S5, and each temperature of the first through fifth stripes S1 through S5 may be changed in time. The substrate 10 may return to a temperature before the exposure process after the exposure process ends completely. The exposure simulation operation (S103) may provide the temperature profile of the substrate 10 in time.

Figure 4:
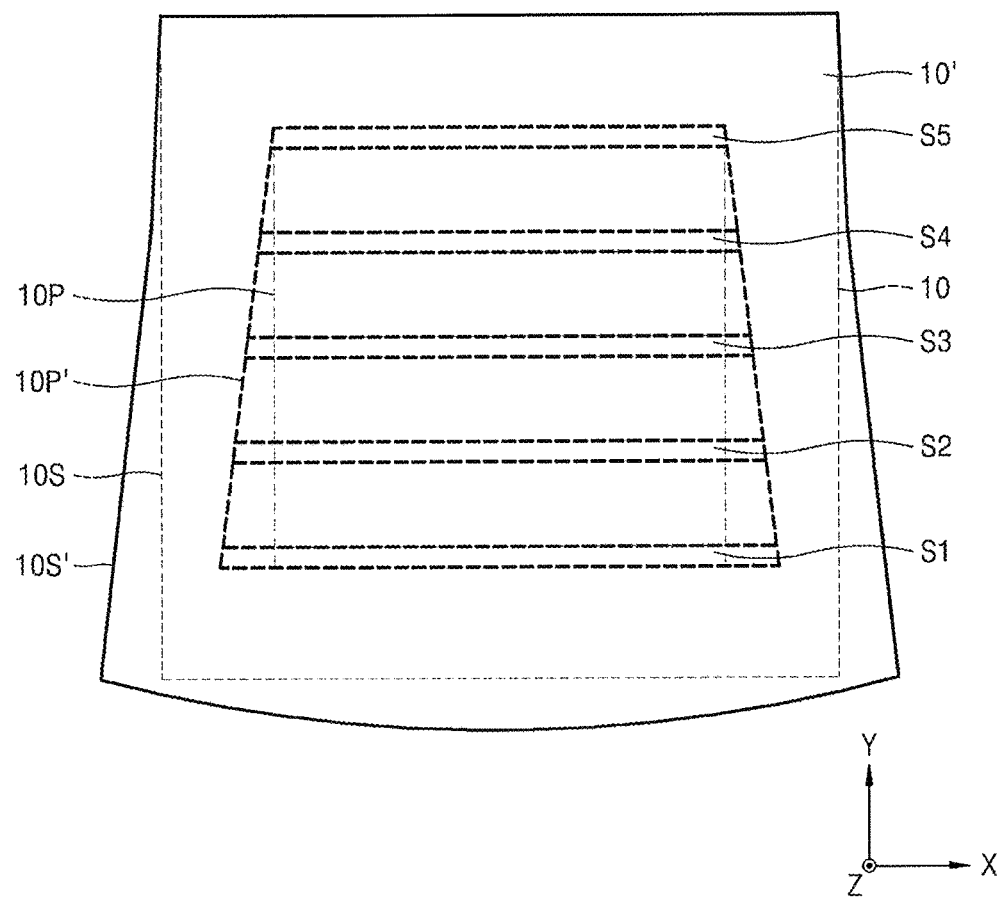
FIG. 4 illustrates a view of a deformation rate of a substrate during an exposure simulation, according to embodiments.

FIG. 4 illustrates a view of a deformation rate of a substrate during an exposure simulation, according to embodiments. Referring to FIGS. 1 and 4, in operation S105, a deformation rate of a deformed substrate 10' obtained from the temperature profile of FIG. 3 may be calculated based on the temperature profile of the substrate 10 and heat deformation rates of materials of the substrate 10. The deformation rate of the substrate 10' may be obtained by comparing an edge profile 10S of the substrate 10 before deformation with an edge profile 10S' of the substrate 10 after deformation. A pattern formation region 10P' in the substrate 10' may also be deformed according to the deformation of the substrate 10'.

FIG. 3 illustrates the operation of exposing the first stripe S1 via a line-shaped electron beam. The lower portion of the substrate 10 adjacent to the first stripe S1 is mainly expanded in FIG. 3.

FIG. 4 illustrates, for example, the operation of exposing the first stripe S1 during the exposure simulation. In an embodiment, the exposure simulation may include an operation of exposing the substrate 10' while continuously moving the electron beam from the first stripe S1 to the fifth stripe S5 in a Y-direction, and a profile having the expanded edge profile 10S' around each of the second through fifth stripes S2 through S5 may be formed. Respective deformation rates of the first through fifth stripes S1 through S5 may be calculated.

Figure 5:
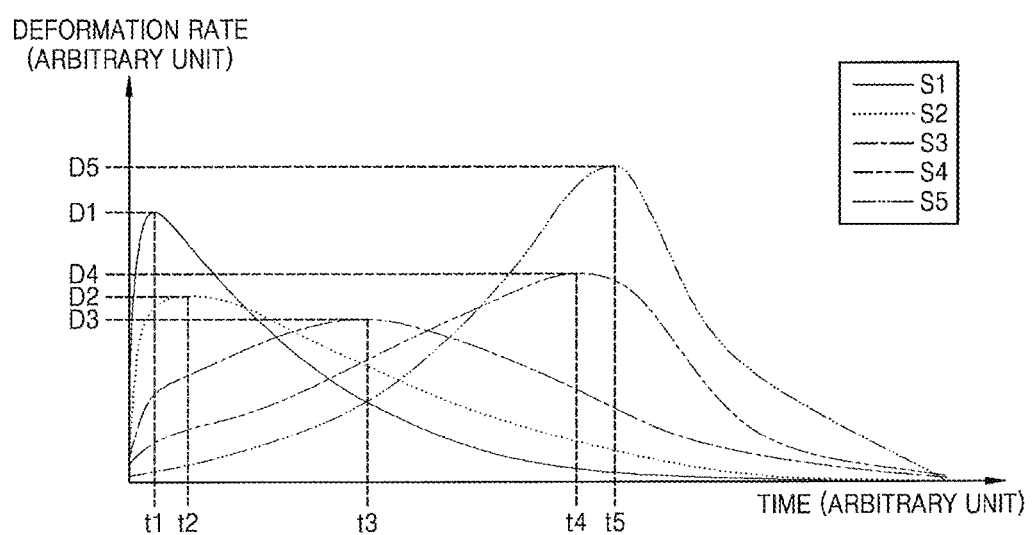
FIG. 5 illustrates a graph of a deformation rate of a stripe in time during an exposure simulation, according to embodiments.

The line-shaped electron beam may move sequentially the first through fifth stripes S1 through S5, and the deformation rates of the first through fifth stripes S1 through S5 may vary in time. A temperature of the substrate 10' may decrease to that before the exposure process after the exposure process ends completely, and the substrate 10' may shrink to same size before the deformation. The exposure simulation operation (S103) may provide the temperature profile of the substrate 10' in time. FIG. 5 will be described below.

FIG. 5 illustrates a graph of a deformation rate of a stripe in time during an exposure simulation, according to embodiments. FIG. 5 illustrates respective deformation rates of the first through fifth stripes S1 through S5 in FIGS. 3 to 4 in time, and respective position data of a pattern formed on each of the first through fifth stripes S1 through S5 may be corrected according to the respective deformation rates of the first through fifth stripes S1 through S5.

Referring to FIGS. 3 and 4, the line-shaped electron beam may expose the first stripe S1 early in the exposure simulation. Early in the exposure simulation, the deformation rate of the first stripe S1 may become larger from a deformation rate 0 with the lapse of time and may reach a first maximum deformation rate D1 at a first point in time t1. The second stripe S2 adjacent to the first stripe S1 may be affected by exposure on the first stripe S1, and may have a relatively high deformation rate from early in the exposure simulation to the first point in time t1. After the exposure on the first stripe S1 is completed, the electron beam may expose the second stripe S2 after completing the exposure on the first stripe S1, the first stripe S1 may not be exposed anymore, and a deformation rate of the first stripe S1 may be reduced as a temperature of the first stripe S1 is gradually reduced after the first point in time t1. The deformation rate of the second stripe S2, where the exposure begins, may gradually increase even after the first point in time t1 and may reach a second maximum deformation rate D2 at a second point in time t2.

Similarly, the third stripe S3 may have a third maximum deformation rate D3 at a third point in time t3, the fourth stripe S4 may have a fourth maximum deformation rate D4 at a fourth point in time t4, and the fifth stripe S5 may have a fifth maximum deformation rate D5 at a fifth point in time t5. After the exposure process is completed, the substrate 10 may be cooled down and the deformation rates of the first through fifth stripes S1 through S5 may become zero, respectively.

Position data of each pattern formed on the first through fifth stripes S1 through S5 may be corrected based on a deformation rate at a point in time when each of the stripes is exposed. For example, position data of a pattern formed on the first stripe S1 may be corrected based on the deformation rate of the first stripe S1 at a point in time when the first stripe S1 is exposed.

In some embodiments, when the first stripe S1 has a maximum deformation rate, the maximum deformation rate may be a deformation rate at a point in time when the first stripe S1 is exposed. Position data of a pattern formed on the first stripe S1 may be corrected such that the pattern may have a deformation rate according to the first maximum deformation rate D1. Position data of a pattern formed on the second stripe S2 may be corrected such that the pattern may have a deformation rate according to the second maximum deformation rate D2. Similarly, position data of patterns formed on the third to fifth stripes S3 to S5 may be corrected such that the patterns may have deformation rates according to the third to fifth maximum deformation rates D3 to D5, respectively.

In embodiments, a deformation rate of the first stripe S1 at a maximum temperature may be a deformation rate at a point in time when the first stripe S1 is exposed.

A correction map with respect to the entire substrate 10 may be generated by extracting the corrected position data of patterns on the first through fifth stripes S1 through S5, respectively.

Figure 6A:
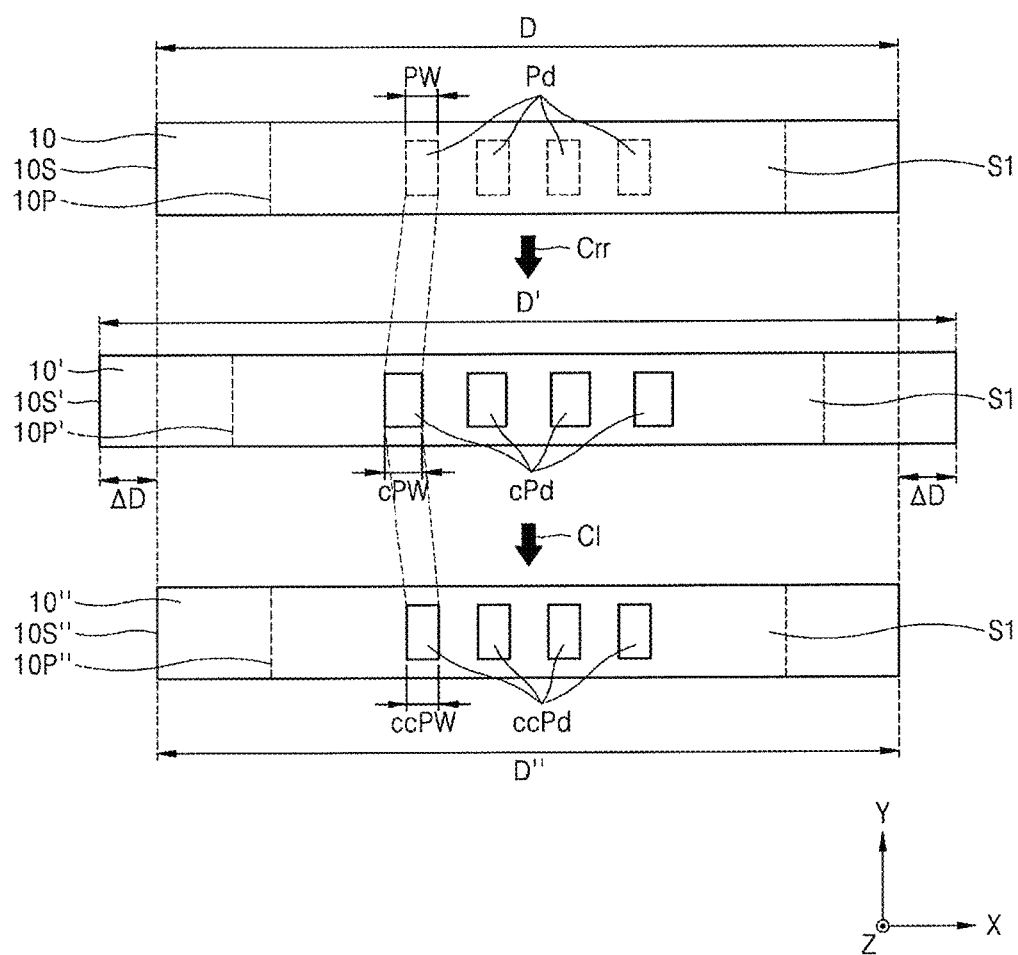
FIG. 6A illustrates a sequential view of position data of a pre-corrected pattern, a pattern exposed according to position data of a corrected pattern, and a completed pattern.
Figure 6B:
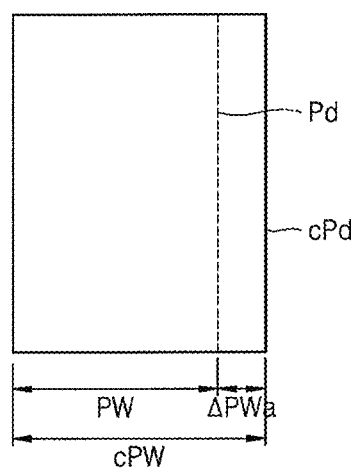
FIG. 6B illustrates a view comparing a size of pattern of a position data of pre-corrected pattern with that of a corrected pattern.
Figure 6C:
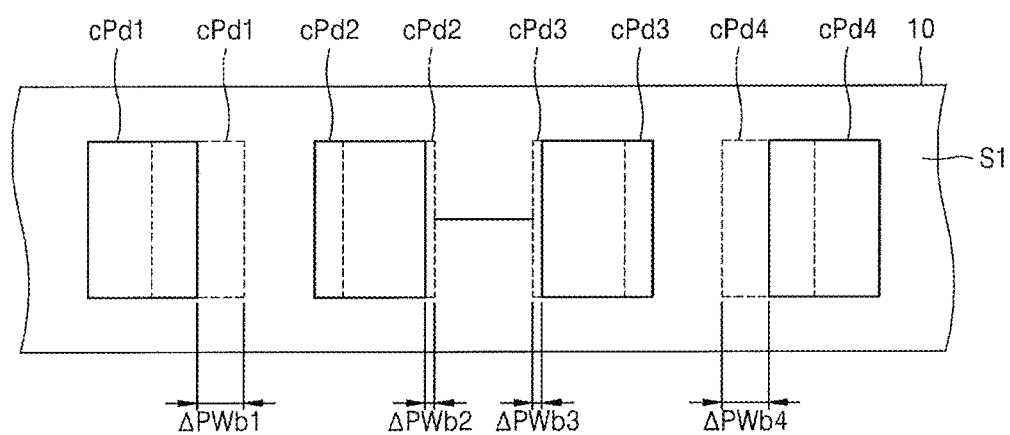
FIG. 6C illustrates a view comparing a position of a position data of a pre-corrected pattern with that of a corrected pattern.

FIG. 6A illustrates a sequential view of position data of a pre-corrected pattern, a pattern exposed according to position data of a corrected pattern, and a completed pattern. FIG. 6B illustrates a view comparing a size of pattern of a position data of pre-corrected pattern with that of a corrected pattern. FIG. 6C illustrates a view comparing a position of a position data of a pre-corrected pattern with that of a corrected pattern.

Referring to FIG. 6A, position data Pd of a pattern before correction, which may be arranged on the first stripe S1 of the substrate 10 before an actual exposure process is performed, is illustrated in an upper portion of FIG. 6A. The position data of the pattern before correction corresponds to a registration state of a pattern to be finally formed on the substrate 10.

A middle portion of FIG. 6A illustrates deformation of the substrate 10' in an actual exposure process. The deformed substrate 10' may have a second substrate width D' after expanding by a prescribed deformation amount ΔD from a first substrate width D before deformation at both sides thereof. The deformed substrate 10' may have position data cPd of a corrected pattern. A second pattern width cPW included in the position data cPd of the corrected pattern, whose alignment may be formed toward outside according to expansion of the substrate 10', may be greater than a first pattern width PW included in the position data Pd of the pattern before correction.

Referring to FIG. 6B, the second pattern width cPW included in the position data cPd of the corrected pattern may increase by a prescribed deformation amount ΔPWa greater than the first pattern width PW included in the position data Pd of the pattern before correction.

A deformation rate of the position data cPd of the corrected pattern may be based on a deformation rate of the substrate 10'. The second pattern width cPW/first pattern width PW may be proportional to the second substrate width D'/first substrate width D, for example. In an embodiment, other relationships may exist between the deformation rates of the position data cPd of the corrected pattern and the substrate 10'.

Referring to FIG. 6C, respective registrations of position data Pd1 through Pd4 of the pattern before correction and position data cPd1 through cPd4 of the corrected pattern are compared to each other after arranging the position data Pd1 through Pd4 and cPd1 through cPd4 on the deformed substrate 10'.

The position data Pd1 through Pd4 of the pattern before correction may have a different alignment from the position data cPd1 through cPd4 of the corrected pattern based on the deformation rate of the substrate 10'. The first and second corrected patterns cPd1 and cPd2 located in a left side with respect to the center are arranged toward a left side compared to the first non-corrected pattern Pd1 and the second non-corrected pattern Pd2. According to the deformation rate of the substrate 10', a first interval Δ PWb1 between the first corrected pattern cPd1 and the first non-corrected pattern Pd1 spaced apart from the center may be greater than a second interval Δ PWb2 between the second corrected pattern cPd2 and the second non-corrected pattern Pd2 adjacent to the center.

Similarly, the third and fourth corrected patterns cPd3 and cPd4 located in a right side with respect to the center are arranged toward a right side compared to the third non-corrected pattern Pd3 and the fourth non-corrected pattern Pd4. According to the deformation rate of the substrate 10', a fourth interval Δ PWb4 between the fourth corrected pattern cPd4 and the fourth non-corrected pattern Pd4 spaced apart from the center may be greater than a third interval Δ PWb3 between the third corrected pattern cPd3 and the third non-corrected pattern Pd3 adjacent to the center.

Referring again to FIG. 6A, a substrate 10″ including a completed pattern ccPd after finishing the exposure process is illustrated in a lower portion of FIG. 6A. After the exposure process is completed, the substrate 10″ may have been deformed in time due to, for example, a heating effect caused by, for example, the exposure, and then may be cooled down and shrink to an original size, e.g., that of substrate 10. A size of the cooled substrate 10″ may be substantially the same as that of the substrate 10 before exposure.

The completed pattern ccPd formed on the substrate 10″ may also shrink according to the shrinkage of the substrate 10″, and a pattern formed on the substrate 10′ deformed based on the position data cPd of the corrected pattern during the exposure may form the pattern ccPd and a completed pattern width ccPW matching the original pattern and alignment Pd and PW.

FIG. 7 illustrates a flowchart of a method 200 of manufacturing a reticle according to embodiments. The method 200 of manufacturing the reticle is similar to the method 100 of manufacturing a reticle described with respect to FIG. 1, but may further include an operation of measuring an exposure time per stripe during actual exposure of a substrate and an operation of further including the exposure time per stripe in an exposure condition.

Referring to FIG. 7, in operation S201, a primary substrate may be prepared, position data of a pattern to be formed on the primary substrate may be determined, and a primary exposure condition may be set. The primary substrate may not be to form a reticle, but may be a preliminary substrate used for measuring an exposure time per stripe. The primary substrate, which may be used for more precisely predicting a deformation rate of a secondary substrate to be formed by a reticle, may be the same type as the secondary substrate.

Afterwards, in operation S203, a primary exposure simulation with respect to the primary substrate may be performed based on the position data of the pattern and the primary exposure condition. A size of the primary substrate may change according to the primary exposure simulation, and in operation S205, a primary deformation rate of the primary substrate, which may be generated in a primary exposure simulation, may be calculated. In operation S207, the position data of the pattern may be primarily, e.g., firstly, corrected according to the primary deformation rate.

Actual primary exposure may be performed on the primary substrate based on the position data of the primarily, e.g., firstly, corrected pattern and the primary exposure condition. In operation S209, an exposure time per of each stripe of the primary substrate may be measured. The exposure time per stripe may be a more specific exposure condition than a pattern density per zone, an exposure dose per unit region, total injection energy, or a total exposure time, and the exposure time per stripe may be an important parameter reflecting respective size deformation rates of stripes of a substrate during an exposure simulation. An exposure simulation based on the exposure time per stripe may be realized to match actual exposure, and it may be possible to accurately predict a deformation rate of the substrate and generate a considerably improved correction map of position data of a pattern.

In operation S210, a secondary exposure simulation regarding, e.g., for or on, the secondary substrate may be performed based on the primary exposure condition, a secondary exposure condition including the exposure time per stripe, and the position data of the primarily, e.g., firstly, corrected pattern. In operation S213, a secondary deformation rate of the secondary substrate, which may be generated in the secondary exposure simulation, may be calculated.

Afterwards, in operation S215, the position data of the primarily, e.g., firstly, corrected pattern may be secondarily corrected according to the secondary deformation rate. Lastly, in operation S217, based on the position data of the secondarily corrected pattern, the secondary substrate may be secondarily exposed under a secondary exposure condition, and the original pattern may be formed with high accuracy.

Figure 8:
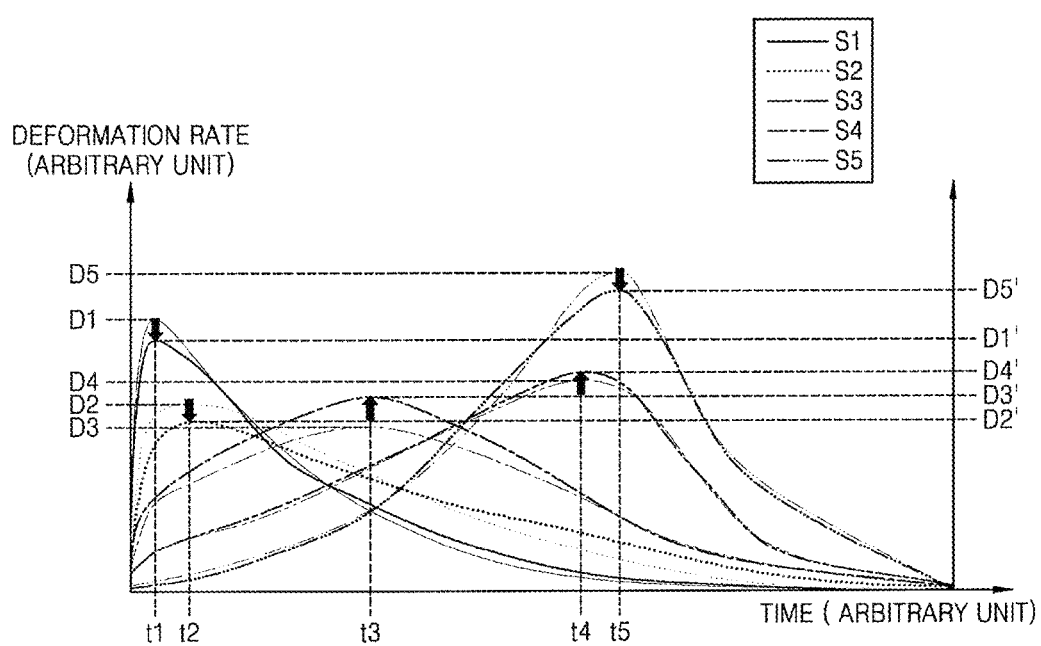
FIG. 8 illustrates a graph of a time variation of a deformation rate of a substrate when a time variation of the deformation rate per stripe in time is according to the exposure simulation described with respect to FIG. 7.

FIG. 8 illustrates a graph of a time variation of a deformation rate of a substrate when a time variation of the deformation rate per stripe in time is according to the exposure simulation described with respect to FIG. 7. A graph of an exposure simulation performed under a primary exposure condition such as a pattern density per zone, an exposure dose per unit region, total injection energy, or a total exposure time is illustrated via a faint line, and a graph of an exposure simulation performed under a secondary exposure condition including the primary exposure condition and an exposure time per stripe is illustrated via a bold line.

Referring to FIG. 8, the exposure time per stripe may be a more specific exposure condition than the primary exposure condition such as a pattern density per zone, an exposure dose per unit region, total injection energy, or a total exposure time. An exposure simulation under an exposure condition including the exposure time per stripe may be more close to an actual exposure process, and the deformation rate of the substrate may be more similar to a deformation rate of a substrate in an actual exposure process.

For example, a first stripe S1 may have a corrected first maximum deformation rate D1′ not a first maximum deformation rate D1 at a first point in time t1, and a second stripe S2 may have a corrected second maximum deformation rate D2′ not a second maximum deformation rate D2 at a second point in time t2. Similarly, the third stripe S3 may represent a third maximum deformation rate D3′ corrected at third point in time t3, the fourth stripe S4 may represent a fourth maximum deformation rate D4′ corrected at a fourth point in time t4, and the fifth stripe S5 may represent a fifth maximum deformation rate D5′ corrected at a fifth point in time t5.

Figure 9:
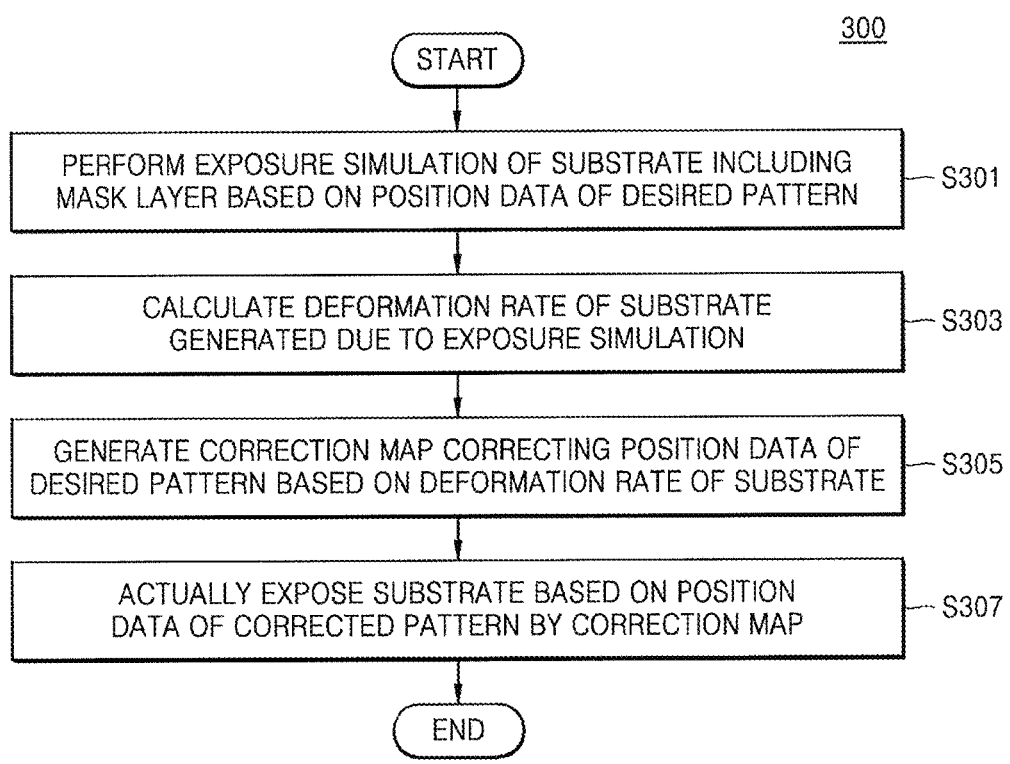
FIG. 9 illustrates a flowchart of a method of correcting a mask pattern according to embodiments.

FIG. 9 illustrates a flowchart of a method 300 of correcting a mask pattern according to embodiments. Referring to FIG. 9, in operation S301, an exposure simulation with regard to, e.g., for or on, a substrate including a mask layer may be performed based on position data of a desired pattern to be formed on the substrate. Afterwards, in operation S303, a deformation rate of the substrate generated during the exposure simulation may be calculated. In operation S305, a correction map for correcting the position data of the desired pattern based on the deformation rate of the substrate may be generated. Lastly, in operation S307, the mask layer of the substrate may actually be exposed based on the position data of a corrected pattern by the correction map and a mask pattern may be formed corresponding to the desired pattern.

The corrected pattern formed on a deformed substrate may have same position data as an original pattern before the actual exposure is performed although the pattern formed on the deformed substrate may shrink in time, and a mask pattern having better registration may be formed.

The mask pattern may be a reticle for selectively scanning light on a wafer or a pattern layer for covering an upper surface of the wafer.

FIGS. 10A and 10B respectively show electron beam exposure devices 20 and 30 used in a method of manufacturing a reticle and a method of correcting a mask pattern, according to embodiments. The electron beam exposure devices 20 and 30 may form a writer system for forming a pattern on a reticle. The electron beam exposure devices 20 and 30 may perform an exposure simulation and respectively include controllers 22 and 32 for calculating a deformation rate of a substrate which may be represented during the exposure simulation and for correcting position data of the pattern.

Referring to FIG. 10A, the electron beam exposure device 20 may output a single electron beam B. The electron beam exposure device 20 may form a shape of a beam, and the electron beam B may be scanned onto a substrate 10 in a simple shape such as a triangle or square with various sizes. A heating effect caused by, for example, the single electron beam B, may greatly affect a local region during an exposure process and also an entire region of the substrate 10, and a registration deformation of the substrate 10 may be caused. According to the methods 100 and 200 of manufacturing a reticle and the method 300 of correcting the mask pattern in FIGS. 1 through 9, a designed pattern may be formed on the substrate 10 with high accuracy without being affected by the registration deformation of the substrate 10.

Referring to FIG. 10B, the electron beam exposure device 30 may output a plurality of electron beams MB, and a total writing time of each of the electron beams MB may relatively be short. A heating effect caused by, for example, the electron beam exposure device 30 outputting the plurality of electron beams MB, may be relatively large with respect to the entire region of the substrate 10, while the heating effect may be relatively small in a local region of the substrate 10. The registration deformation of the substrate 10 may be large when an exposure process to form a pattern on the substrate 10 is performed. According to the methods 100 and 200 of manufacturing a reticle and the method 300 of correcting a mask pattern described with respect to FIGS. 1 through 9, a pattern may be formed on the substrate 10 with high accuracy without being affected by registration deformation of the substrate 10, even when the electron beam exposure device 30 is used.

By way of summation and review, when performing reticle exposure to form a pattern, a size deformation or expansion of the reticle may occur due to, for example, a heating effect caused during the exposure, and a registration error, such as misalignment of the pattern formed on the reticle, may be generated. For example, in the case of using a high dose exposure device, a registration error caused by, for example, thermal deformation of a reticle, may be increased further. Accordingly, a technique of correcting in real-time a pattern during forming thereof may be used.

According to a method of correcting a mask pattern and a method of manufacturing a reticle using the method of correcting a mask pattern of embodiments, a deformation of a substrate, which may occur during an actual exposure process, may be predicted in advance by performing an exposure simulation under the same exposure conditions as in the actual exposure process. According to the methods of embodiments, a correction map for correcting pattern data so as to compensate for the deformation of a substrate may be generated. By correcting the designed pattern data based on the correction map before the actual exposure process is performed, corresponding calculation time and correction time may change. According to embodiments, it may be possible to form a designed pattern with high accuracy in spite of the deformation of a substrate.

Embodiments may provide a method of correcting a mask pattern whereby pattern misalignment caused by, for example, deformation of a mask pattern or a reticle due to, for example, heating effect according to exposure, may be corrected, and a method of manufacturing a reticle using the method of correcting a mask pattern. Embodiments may provide to a method of correcting a mask pattern whereby pattern misalignment caused by, for example, a registration error of a substrate, may be corrected, and a method of manufacturing a reticle using the method of correcting a mask pattern.

In embodiments, one or more outputs may take various forms. For example, when the controller is embodied within an integrated circuit chip, the one or more outputs may be one or more output terminals, leads, wires, ports, signal lines, and/or other type of interface without or coupled to the controller.

The controllers and other processing features of the embodiments described herein may be implemented in logic, which, for example, may include hardware, software, or both. When implemented at least partially in hardware, the controllers and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Example embodiments have been disclosed herein, and although specific terms are employed, they are used and are to be interpreted in a generic and descriptive sense only and not for purpose of limitation. For example, while linear exposure has been described in detailed herein, correction and mapping may be used for other exposure profiles. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a reticle, the method comprising:
preparing a substrate, determining position data of a pattern to be formed on the substrate, and setting a primary exposure condition to form the pattern;

performing a primary exposure simulation regarding the substrate based on the position data of the pattern and the primary exposure condition;

calculating a primary deformation rate of the substrate, which is generated in the primary exposure simulation;

correcting the position data of the pattern based on the primary deformation rate of the substrate to provide a corrected position data of the pattern;

exposing the substrate under the primary exposure condition based on the corrected position data of the pattern;

performing a secondary exposure simulation on a secondary substrate based on a secondary exposure condition and the corrected position data of the pattern;

calculating a secondary deformation rate of the secondary substrate, which is generated in the secondary exposure simulation; and secondarily correcting the corrected position data of the pattern according to the secondary deformation rate of the second substrate.

2. The method as claimed in claim 1, wherein the primary exposure condition is one or more of a pattern density per unit region, an exposure dose per unit region, total injection energy, a total exposure time, injection energy per stripe, or an exposure time per stripe with regard to the substrate.

3. The method as claimed in claim 1, wherein performing the primary exposure simulation includes calculating a temperature profile of the substrate and calculating a deformation rate of the substrate based on the temperature profile.

4. The method as claimed in claim 1, wherein performing the primary exposure simulation includes calculating a deformation rate of the substrate in time.

5. The method as claimed in claim 1, wherein:
the primary exposure simulation is performed on every stripe forming the substrate, and
calculating the primary deformation rate includes calculating a deformation rate of each of stripes forming the substrate.

6. The method as claimed in claim 5, wherein in calculating the primary deformation rate, the primary deformation rate of each of the stripes is a deformation rate when each of the stripes is exposed.

7. The method as claimed in claim 5, wherein in calculating the primary deformation rate, the primary deformation rate of each of the stripes is a deformation rate when each of the stripes is deformed in maximum.

8. The method as claimed in claim 5, wherein in calculating the primary deformation rate, the primary deformation rate of each of the stripes is a deformation rate of each of the stripes at a maximum temperature.

9. The method as claimed in claim 1, wherein calculating the primary deformation rate includes calculating a deformed profile of an edge on the substrate.

10. The method as claimed in claim 5, wherein:
calculating the primary deformation rate includes calculating a deformation rate of each of the stripes on the substrate, and
correcting the position data of the pattern based on the primary deformation rate of the substrate includes correcting the position data of the pattern so that a pattern located in each of the stripes is a pattern having a deformation rate according to the deformation rate of each of the stripes.

11. A method of manufacturing a reticle, the method comprising:

preparing a substrate, determining position data of a pattern to be formed on the substrate, and setting a primary exposure condition to form the pattern;

performing a primary exposure simulation regarding the substrate based on the position data of the pattern and the primary exposure condition;

calculating a primary deformation rate of the substrate, which is generated in the primary exposure simulation;

correcting the position data of the pattern based on the primary deformation rate of the substrate to provide a corrected position data of the pattern; and exposing the substrate under the primary exposure condition based on the corrected position data of the pattern, wherein:

exposing the substrate under the primary exposure condition based on the corrected position data of the pattern further includes measuring an exposure time with respect to each of stripes while exposing the stripes forming the substrate, and the method further comprises, after exposing the substrate under the primary exposure condition based on the corrected position data of the pattern, under a secondary exposure condition including the primary exposure condition and the exposure time of each of the stripes:

performing a secondary simulation on a secondary substrate;

calculating a secondary deformation rate of the secondary substrate; and correcting the position data of the pattern based on the secondary deformation rate of the secondary substrate to provide a corrected position data of the pattern under the secondary exposure condition.

12. The method as claimed in claim 11, further comprising exposing the secondary substrate based on the corrected position data of the pattern under the secondary exposure condition.

13. The method as claimed in claim 1, wherein an exposure device used for performing the primary exposure simulation is a multi beam exposure device.

14. The method as claimed in claim 1, wherein an exposure device used for performing the primary exposure simulation is a variable shaped beam exposure device.

15. A method of correcting a mask pattern, the method comprising:

performing an exposure simulation with regard to a substrate including a mask layer based on position data of a desired pattern;

calculating a deformation rate of the substrate, which is generated in the exposure simulation;

generating a correction map correcting the position data of the desired pattern based on the deformation rate of the substrate;

exposing the mask layer of the substrate based on the corrected position data of the desired pattern by the correction map and forming a mask pattern;

performing a secondary exposure simulation on a secondary substrate based on a secondary exposure condition and the corrected position data of the desired pattern;

calculating a secondary deformation rate of the secondary substrate, which is generated in the secondary exposure simulation; and secondarily correcting the corrected position data of the desired pattern according to the secondary deformation rate of the second substrate.

* * * * *